United States Patent

[11] 3,591,911

[72] Inventor Sandor Goldschmied
Anaheim, Calif.
[21] Appl. No. 863,397
[22] Filed July 14, 1969
[45] Patented July 13, 1971
[73] Assignee Burroughs Corporation
Detroit, Mich.
Continuation of application Ser. No. 589,071, Oct. 24, 1969, now abandoned.

[54] MACHINE AND METHOD FOR MOUNTING ELECTRICAL COMPONENTS ON A PRINTED CIRCUIT BOARD
44 Claims, 11 Drawing Figs.

[52] U.S. Cl. .......... 29/203, 29/626
[51] Int. Cl. .......... H05k13/04, H05k 3/30
[50] Field of Search .......... 29/203, 203 DT, 203 B, 626, 211 C; 140/71

[56] References Cited

UNITED STATES PATENTS

| | | | |
|---|---|---|---|
| 2,867,810 | 1/1959 | Gagnon | 28/203 |
| 2,869,129 | 1/1959 | Rogers, Jr. | 140/71 X |
| 3,151,387 | 10/1964 | Clemens et al. | 29/203 |
| 3,257,708 | 6/1966 | Stricker | 29/626 |
| 3,341,926 | 9/1967 | Durr et al. | 29/203 |

*Primary Examiner*—Thomas H. Eager
*Attorney*—Christie, Parker & Hale

ABSTRACT: A machine and method are disclosed for inserting the leads of electrical components through holes in a printed circuit board. Included in the machine are assemblies for selecting one of a variety of different kinds of components and selecting the location on the circuit board at which the selected component leads are to be inserted. Preparatory to insertion, the leads of the selected component are straightened, cut, and chamfered on a component block assembly. The circuit board is mounted on a backplate having longitudinal grooves with inwardly sloping sidewalls that bend the leads after insertion through the circuit board.

INVENTOR.
SANDOR GOLDSHCMIED

BY
Christie, Parker & Hale
ATTORNEYS

INVENTOR.
SANDOR GOLDSCHMIED
BY
Christie, Parker & Hale
ATTORNEYS

INVENTOR.
SANDOR GOLDSCHMIED
BY
Christie, Parker & Hale
ATTORNEYS

INVENTOR.
SANDOR GOLDSCHMIED
BY
Christie, Parker & Hale
ATTORNEYS

INVENTOR.
SANDOR GOLDSCHMIED

BY
Christie, Parker & Hale
ATTORNEYS

MACHINE AND METHOD FOR MOUNTING ELECTRICAL COMPONENTS ON A PRINTED CIRCUIT BOARD

This application is a continuation of application Ser. No. 589,071, filed Oct. 24, 1966, now abandoned. This invention relates to the fabrication of printed circuit boards and, more particularly, to a machine and method for inserting the leads of electrical components through small, closely spaced holes in a printed circuit board.

At present, electrical components are mounted on printed circuit boards by manually inserting the component leads through holes in the board. After insertion of the leads, they are bent in order to secure the components temporarily until the leads are soldered to the board. Usually a single board employs numerous different types of components that are placed in different locations on the board, depending upon the circuit design and the circuitry actually printed on the board. Therefore, manual insertion of the component leads understandably gives rise to frequent misplacement of components. In addition, manual insertion is a tedious operation requiring a large expenditure of time and concentrated attention on the part of the assembler.

The current trend in the industry is to strive to increase the density of the components and the printed circuitry on the board, thus making the holes in the board smaller and placing them closer together. Furthermore, to facilitate the formation of solder joints between the leads and the circuit board, the holes in the circuit board are drilled just large enough to accommodate the leads. Thus, as the components become smaller and more closely packed together on the circuit board, the difficulties associated with manual insertion are intensified.

Integrated electrical circuits having two rows of leads emanating from opposite sides of a rectangular body, called dual in-line components, are a common type of electrical component used on circuit boards. Mounting such integrated circuits poses an especially serious problem. The tolerances on the relative positioning of the leads in each row, as these integrated circuits are received from the supplier, are relatively large. In trying to insert the leads through rows of small, closely spaces holes, it is easy for them to become broken or bent, and the metal plating around the holes may be scraped off. The utmost care must be taken to align the leads with the holes before insertion. Thus, a particularly large time expenditure and close attention on the part of the assembler is necessitated to mount such integrated circuits on circuit boards satisfactorily.

According to the invention, a machine is provided that inserts the leads of electrical components, and in particular dual in-line integrated circuits, through holes in a printed circuit board with a minimum expenditure of time, possibility of misplacing components, and damage to component leads and circuit board plating. Preparatory to the insertion of a component on the circuit board, the machine straightens, cuts, and chamfers the leads of each integrated circuit on a block assembly in a single, continuous operation. Straightening insures that the leads in each row are arranged in a single straight line, while the chamfering insures that the points of the chamfered tips of the leads are precisely positioned relative to each other. Thereafter, the component, indexed from one of the leads rather than the component body itself, is transported to the circuit board by an inserter head. When the component leads are brought into alignment with the holes in the circuit board through which they are to be inserted, the component is driven down by the inserter head until the leads have penetrated sufficiently into the board and is then ejected by the inserter head.

A special backplate having longitudinal grooves with inwardly sloping sidewalls is utilized to bend the leads in order to secure the components temporarily to the board. The backplate is so positioned that before insertion the component straddles the gap between successive grooves. When the leads are driven through the holes in the circuit board, the sloping sidewalls of the grooves deflect them outwardly, thereby forming the temporary connection.

Another feature of the machine enables selection of one of a plurality of different components to be mounted on a circuit board, as well as selection of one of a plurality of locations on the board in which the leads of the selected component are to be inserted. As a result, all the components on a circuit board can be mounted at a single assembly station.

These and other features of the invention are considered further in the following detailed description taken in conjunction with the drawings, in which:

FIGS. 1, 2, and 3 are front, top sectional, and side sectional views, respectively, of a machine embodying the principles of the invention;

Figure 1:
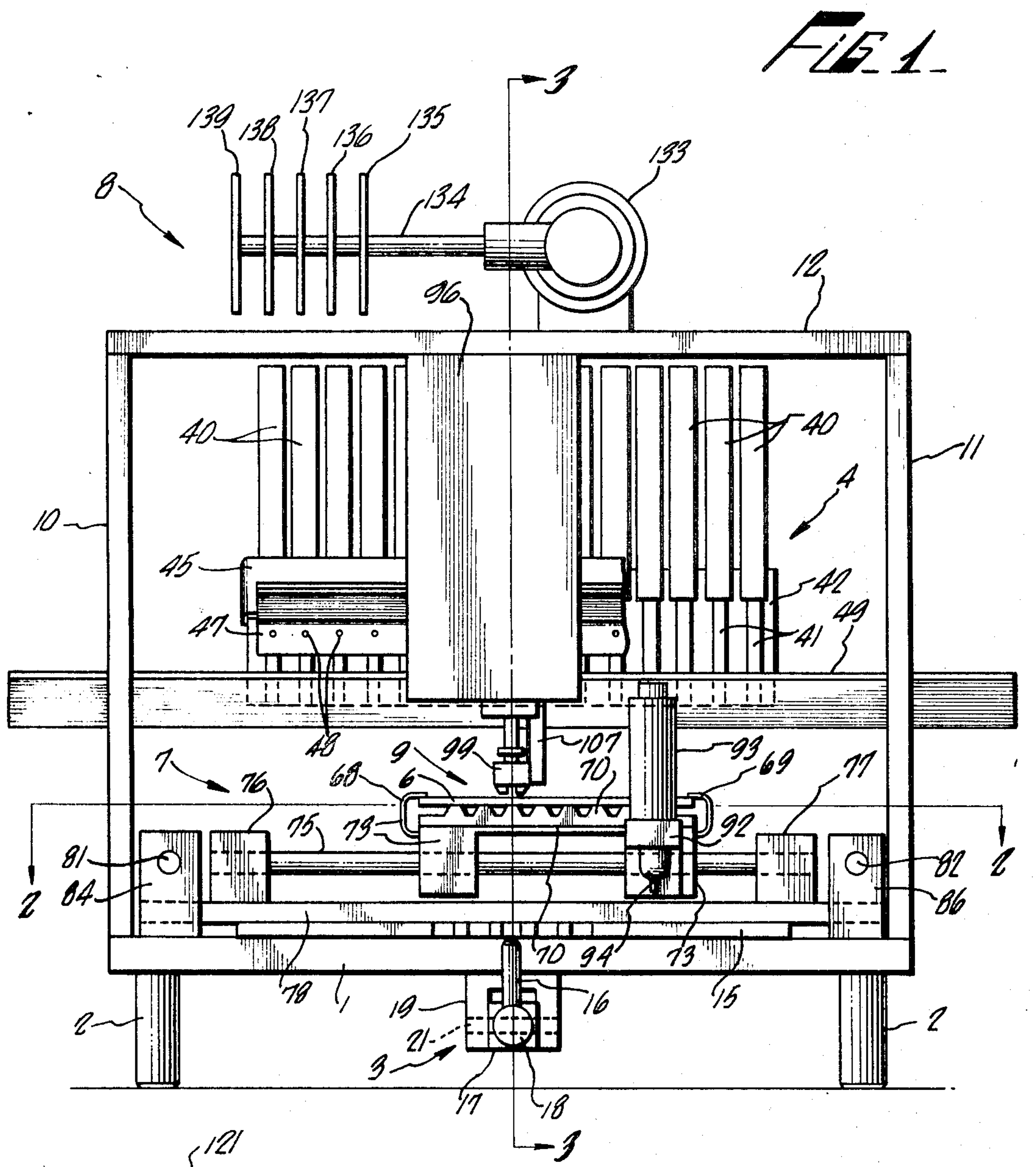
Figure 5:
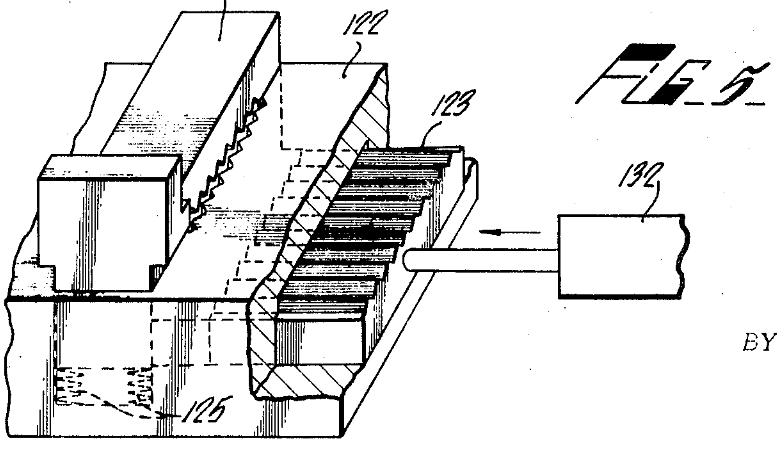
FIG. 5 is a diagram showing the interrelationship of parts of the block assembly on which components are mounted while their leads are straightened, cut, and chamfered.
Figure 2:
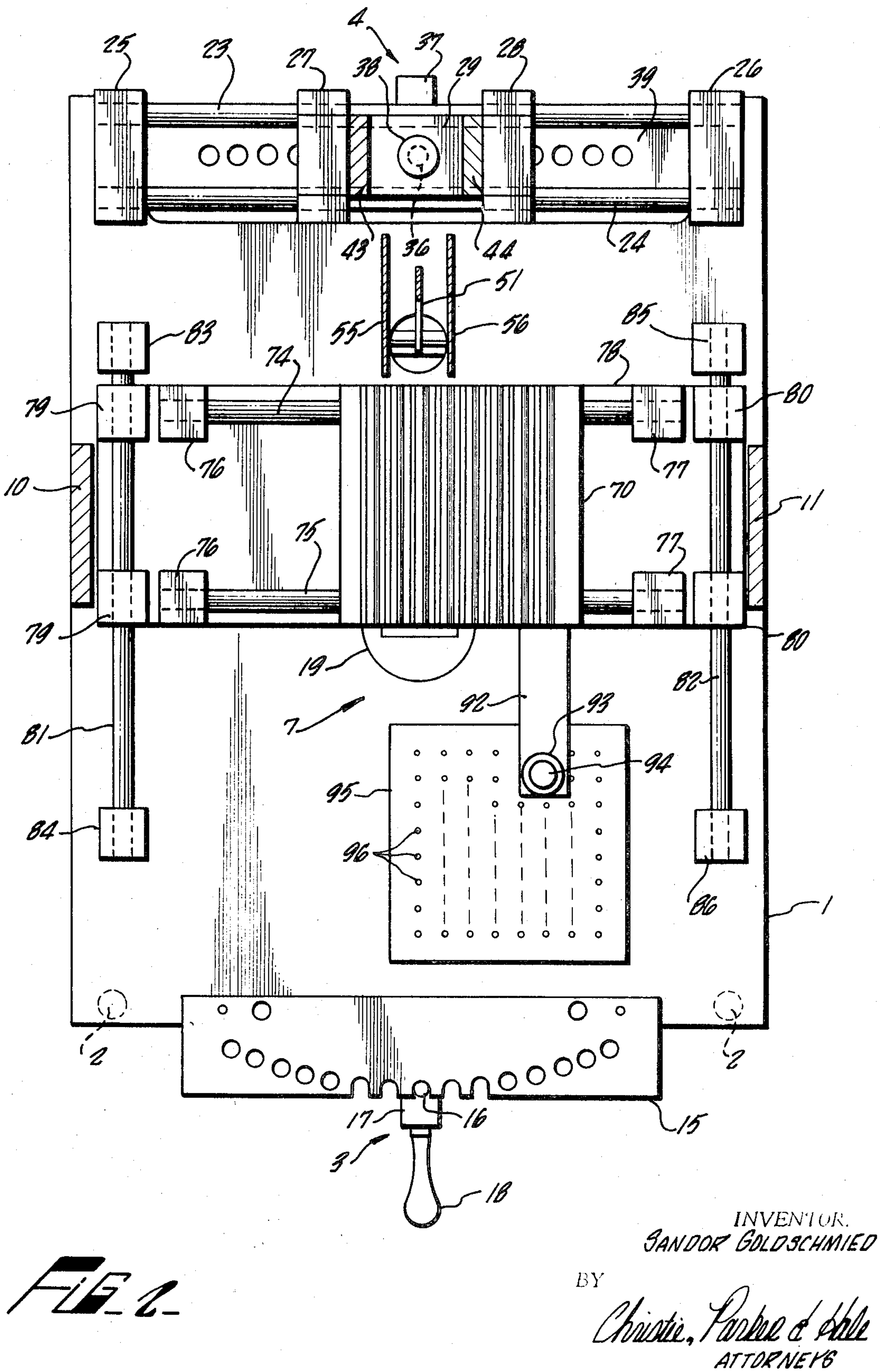
Figures 3, 7, 8:
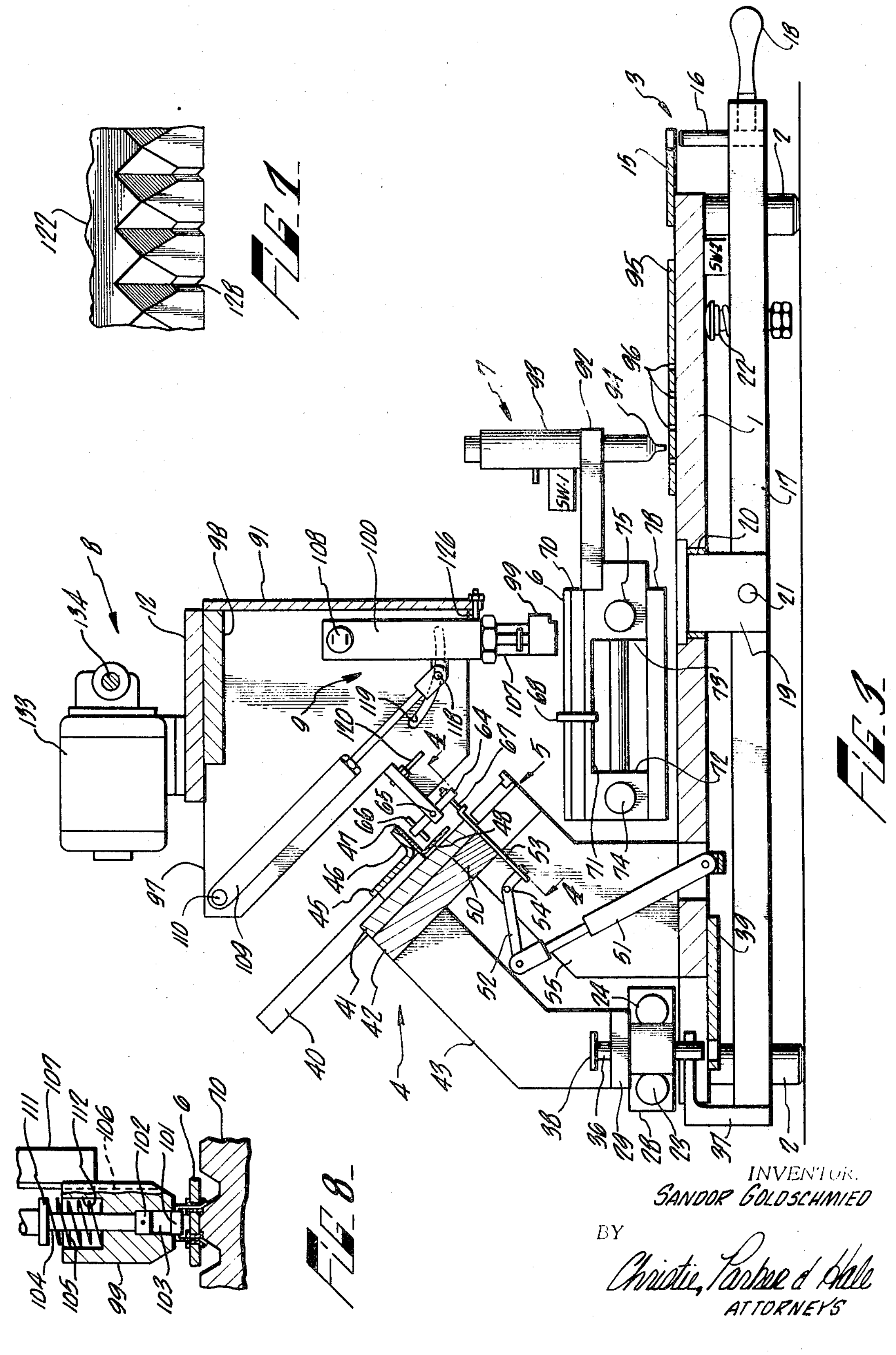
FIG. 7 is a diagram of a portion of the block assembly of FIG. 5 showing the surface that straightens the leads.
FIG. 8 is a sectional view illustrating in detail the construction of the inserter head at the moment in which it is inserting component leads through holes in a circuit board.

Reference is now made to FIGS. 1, 2, and 3 for various views of a machine embodying the principles of the invention. The machine, which is mounted on a rectangular baseplate 1 standing on legs 2, may be broken down into a number of subassemblies for the purpose of a description of its operation. A component selector assembly 3 is coupled to a carriage assembly 4 on which the different kinds of components to be mounted on a circuit board are stored in stacks. A component from the stack of the selected kind moves onto a component block assembly 5 (FIG. 5). A circuit board 6 on which components are to be mounted is coupled to a location selector assembly 7 that determines the holes in the circuit board through which the leads of the selected component are inserted. Thereafter, a cycle is initiated that proceeds under the control of a sequencing assembly 8. Sequencing assembly 8 is mounted on a horizontal top plate 12, which is bridged between vertical sideplates 10 and 11. In the course of the cycle, an inserter head assembly 9 moves to mounting block assembly 5 and grasps the component mounted thereon. Assemblies 5 and 9 cooperate with one another to straighten, cut, and chamfer the leads of the component. Thereafter, inserter head assembly 9 carries the component to a position over the selected location of board 6 and inserts the leads of the component through the appropriate holes in board 6.

Component selector assembly 3 includes a template 15 having as many different holes through it as there are different kinds of components stored on carriage assembly 4. A peg 16 is perpendicularly mounted at one end of a bar 17 that extends to the back of the machine and is connected there to carriage assembly 4. A handle 18 extends axially from the front end of bar 17 to facilitate its movement. Bar 17 is pivotably mounted on a pin 21 supported by a fixture 19. Fixture 19 by itself supported by baseplate 1 so as to rotate within a bushing 20 (FIG. 3). As a result, bar 17 is capable of transferring both the horizontal and vertical displacement of peg 16 to carriage assembly 4. A spring-loaded spacer 22 urges bar 17 downward sufficiently for peg 16 to lie below plate 15 when no upward force is applied to handle 18.

Carriage assembly 4 has parallel rails 23 and 24 that are supported at their ends by fixed blocks 25 and 26. Sliders 27 and 28 ride on rails 23 and 24. A plate 29 is mounted on top of sliders 27 and 28 and is fixed thereto. A shaft 36 passes through an opening in plate 29 and an opening in an L-shaped linkage 37, which is fixed to the rear end of bar 17. The fitting between shaft 36 and plate 29 is designed to permit axial movement of shaft 36, but not rotation. The fitting between shaft 36 and linkage 37 is designed to permit rotation of linkage 37 about shaft 36 without permitting shaft 36 to move axially with respect to linkage 37. A disc 38, which is attached to the top of shaft 36, serves as a stop on its axial movement. A template 39 having a number of holes equal to the number of holes in template 15 is attached to the back of baseplate 1 such that the holes are in alignment with shaft 36 as it rides along rails 23 and 24. As peg 16 is moved under the various holes in template 15, bar 17 rotates in a horizontal plane. This rotation is transformed at the connection between linkage 37 and shaft 36 to a translational motion of sliders 27 and 28 and plate 29. As peg 16 is raised, so as actually to enter one of the holes in plate 15, bar 17 rotates in a vertical plane. Accordingly, shaft 36 drops and enters the hole in template 39 that corresponds to the hole in template 15 which peg 16 has entered. When handle 18 is lifted to insert peg 16 through a particular hole in template 15, bar 17 actuates a pressure-sensitive switch SW-2, which causes a component from the stack of the selected kind to be brought to component block assembly 5 in a manner described in detail below. Since shaft 36 is precisely positioned at the instant in which switch SW-2 is actuated by means of the holes in template 39, the location of carriage assembly 4 when a component is dispensed therefrom is precisely determined, despite any play existing in the coupling provided by bar 17.

The different kinds of components, which are all assumed for purposes of discussion to be dual in-line integrated circuits, are stacked in different tubes 40. Each tube has a groove running along its length that is straddled by the rows of leads. Rails 41, which are narrower at the top than at the bottom, are mounted in parallel relationship on a long plate 42. Plate 42 is attached to plate 29 by support members 43 and 44. A bracket 45 having a flange portion 46 extends along the top of plate 42 in spaced relationship from rails 41 and is fastened to plate 42 at its sides. When a tube is placed in position, its groove engages the narrow portion of rail 41. The tube is then wedged between rail 41 and bracket 45, as illustrated in FIG. 3. A bracket 47 having holes 48 through its surface directly over each of rails 41 is fastened to flange portion 46 of bracket 45.

The ends of tubes 40 placed on rails 41 are open. Thus, the components stored in each tube slide down rail 41 until stopped at its end where they are held by a stationary plate 49 (FIG. 1) attached to side plates 10 and 11 and support members 55 and 56. The movement of plate 42 and rails 41 is guided by a stationary block 50 also attached to sideplates 10 and 11 as well as support members 55 and 56.

Figure 4:
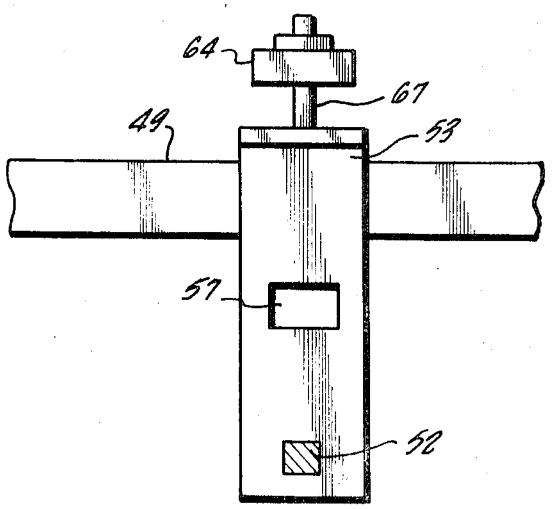
FIG. 4 is a view that depicts the gate through which the selected components pass to the block assembly.

As peg 16 is moved under each hole in template 15, a different tube and rail 41 become positioned in alignment with block assembly 5. To facilitate component selection, each hole in template 15 could be labeled in accordance with the particular kind of component in alignment with block assembly 5 when peg 16 is under the hole. When handle 18 is lifted up, so peg 16 enters one of the holes and switch SW-2 becomes actuated, an air cylinder 51 (FIG. 3) becomes operative. A link 52 connects the arm of cylinder 51 to a component gate 53 that separates carriage assembly 4 from block assembly 5. Link 52 pivots about a pin 54 that is suspended between support members 55 and 56. When air cylinder 51 becomes operative, its arm retracts and gate 53 slides upward. As illustrated in FIG. 4, gate 53 has a passage 57 normally located below plate 49. Passage 57 has sufficient clearance for a component to pass through it. As gate 53 slides upward, a component slides along rail 41, through passage 57 and onto block assembly 5, which is attached to support members 55 and 56. A rod 64 is pivotably mounted on a pin 65 (FIG. 3). At one end rod 64 has a pin 66 and at the other end a pin 67. Rod 64 is spring-loaded so that pin 67 rides against the top flange of gate 53 at all times. As gate 53 slides upward to permit a component to move onto block assembly 5, rod 64 rotates. Consequently, pin 66 passes through hole 48 and holds the next component in the stack to prevent it from sliding through passage 57.

At location selector assembly 7, circuit board 6 is secured to a backplate 70 by clamps 68 and 69. For reasons which will become clear from the description below, backplate 70 has a series of parallel, straight, longitudinal grooves with inwardly sloping sidewalls cut in its upper surface. Backplate 70 is mounted on a table 71 that is supported to move freely in two dimensions in a horizontal plane underneath inserter head assembly 9 (FIG. 2). Specifically, table 71 is carried by sliders 72 and 73 that ride along rails 74 and 75, respectively. Rails 74 and 75 are supported at their ends by blocks 76 and 77. The entire arrangement is mounted on a plate 78. Plate 78 is itself carried by sliders 79 and 80 that ride along rails 81 and 82, respectively. Rail 81 is supported by blocks 83 and 84 while rail 82 is supported by blocks 85 and 86.

An arm 92, which is fixed to slider 73, extends therefrom in a forward direction. A cylinder mechanism 93 housing an extendable spring-loaded pointer 94 is mounted at the extremity of arm 92. A template 95 with holes 96 is mounted on baseplate 1. Each hole 96 corresponds to a different component location on circuit board 6. The holes are located such that, when pointer 94 lies directly over a particular hole in template 95, the corresponding location on board 6 lies directly underneath inserter head assembly 9. The holes in template 95 could be labeled to facilitate selection. To start the cycle, mechanism 93 is moved directly over the hole in template 95 corresponding to the selected component location on board 6. Then pointer 94 is extended into this hole to insure that it is precisely aligned with the hole. Upon extension of pointer 94, a pressure-sensitive switch SW-1 is actuated, which starts the operation of sequencing assembly 8. As described below in connection with !FIG. 10, pointer 94 is held in the hole to lock circuit board 6 in the selected location until the component is fully inserted.

Inserter head assembly 9 has a front panel 91, a side panel 97, and a top panel 98 attached to one another. Top panel 98 is fastened to top plate 12. An inserter head 99 is mounted on the end of an air cylinder 100 that is pivotably attached to side panel 97 by a fastener 108. As illustrated in FIG. 8, inserter head 99 has a slot 103 along its length into which the rectangular body of an integrated circuit 101 fits tightly. Head 99 is actually attached to a rod 104 that extends from the arm of air cylinder 100. The fitting between rod 104 and head 99 permits head 99 to move along the axis of rod 104. A component ejector 102 is fastened to the end of rod 104 within slot 103. A compression spring 105 is seated against a flange 111 on the arm of cylinder 100 and extends into a counterbore 112 in head 99. As a result, head 99 is normally urged away from the arm of cylinder 100 until stopped by ejector 102. Head 99 has a vertical groove 106 in its side that engages a tongue in a guide member 107. Member 107, which is fixed to the body of cylinder 100, serves to guide head 99 as it is moved by the arm of air cylinder 100. An air cylinder 109, which is pivotably attached to side panel 97 by a fastener 110, has an arm with a pawl 118 that rides within an arcuate slit 119 in side panel 97. Pawl 118 is connected to air cylinder 100 by a fitting that permits relative rotation therebetween.

After switch SW-1 is actuated to begin the sequence, gate 53 opens and pin 66 rises. This permits the next component on the stack to slide down flush with plate 49. At the same time, the arm of air cylinder 109 retracts. As a result, air cylinder 100 swings around until it contacts an adjustable stop 120 that fixes its position precisely with respect to block assembly 5. Then the arm of air cylinder 100 extends toward block assembly 5 and slot 103 in inserter head 99 engages the selected component mounted thereon.

As illustrated in FIG. 5, block assembly 5 comprises three major parts: a spring-loaded component mount 121; a stationary block 122; and a pair of cutters 123, only one of which is shown. Each of these parts is serrated. The top surface of cutters 123 and the bottom surface of mount 121 have parallel serrations that are dimensioned and positioned to mesh with each other when mount 121 moves down through block 122 sufficiently. The serrations in block 122 appear on both vertical surfaces adjoining mount 121 and are tapered toward the vertical surfaces of mount 121, as shown in FIG. 7. Near the apex of the tapered serrations, small parallel grooves 128 are formed.

Figure 6A:
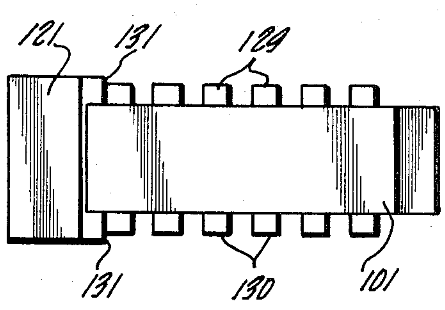
FIGS. 6A and 6B are top and side views, respectively, of the component mount of the block assembly shown with an integrated circuit.
Figure 6B:
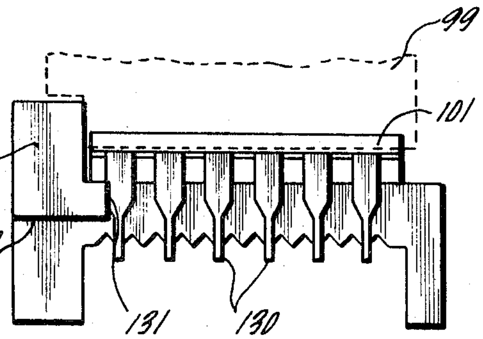

FIGS. 6A and 6B depict integrated circuit 101 on mount 121. Rows of leads 129 and 130 straddle mount 121. Since integrated circuits are made in mass production, their dimensions are not uniform. The distance between the corner of the body of integrated circuit 101 and the first lead in rows 129 and 130 varies substantially from component to component. The position of integrated circuit 101 on mount 121 is accordingly indexed to the first lead in each of rows 129 and 130 rather than to the end of the body of the integrated circuit. Mount 121 has a shoulder 131 on each side. As the selected component from carriage assembly 4 moves onto mount 121, it slides forward until the first lead in each row contacts shoulder 131.

When inserter head 99 engages integrated circuit 101, its position is also indexed to the first lead in each row (FIG. 6B). Springs 125 at the front and back of mount 121 normally urge mount 121 upward into the position shown in FIG. 5. As the arm of cylinder 100 continues to extend after inserter head 99 contacts the integrated circuit, it pushes mount 121 downward. During this operation, the position of inserter head 99 on rod 104 remains fixed because spring 105 is substantially stiffer than springs 125. As mount 121 moves down toward cutters 123, any leads that are bent, particularly those bent out of line from the rows of leads, are deflected by the sloping sides of the tapered serrations and accordingly straightened. The downward movement of mount 121 is limited by shoulders 124 (FIG. 6B). After mount 121 is fully depressed, the leads pass through grooves 128 and protrude from block 122. The serrations on the bottom surface of mount 121 are arranged so their points precisely coincide with the spacing between centers of the holes on circuit board 6, through which the component is to be inserted. When these serrations are on a level with the serrations of cutters 123, the arms of air cylinder 132, which are attached to cutters 123, extend and drive cutters 123 toward mount 121. The serrations of cutters 123 mesh with those of mount 121, thereby cutting and chamfering the tips of the component leads.

Figure 9:
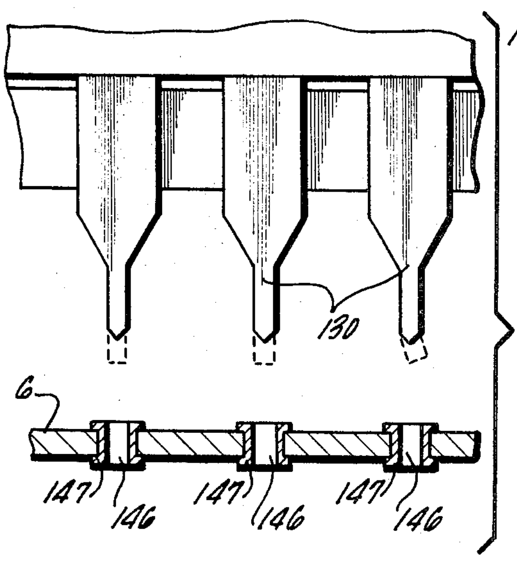
FIG. 9 is a diagram that illustrates how the tips of the component leads are aligned with the holes in the circuit board by chamfering.

FIG. 9 depicts circuit board 6 with precisely centered holes 146 through which the component leads of row 130 are to be inserted. Holes 146 are provided with gold-plated eyelets 147. As illustrated in FIG. 9, chamfering the component leads compensates for any irregularity in their relative placement in row 130. The profile of the leads before cutting and chamfering is represented by the dashed outlines extending from the ends of the leads. Before cutting, the lead on the right end of row 130, for example, is bent so it would not enter its corresponding hole when lowered. Instead, it would be further bent and miss the hole entirely. The points on the chamfered tips of the component leads are precisely spaced to correspond to the centers of the holes in the circuit board. Therefore, upon insertion in the holes, misaligned leads are deflected by the chamfered tips so as to pass through holes 146. In addition, the chamfered tips prevent damage to the plating on eyelets 147. The preparation of the rows of leads by straightening and chamfering them permits the use of smaller, more closely spaced holes in the circuit board.

After the leads of the component are straightened, cut, and chamfered, the arm of air cylinder 100 retracts carrying the component with it. Then the arm of air cylinder 109 extends to swing cylinder 100 back against an adjustable stop 126 in front panel 91 (FIG. 3). At this point, inserter head 99 is precisely positioned over the selected location on board 6. Since the position of the selected component in inserter head 99 is indexed to the first lead in the rows, the tips of the chamfered leads of the component are precisely aligned with the centers of the holes in the circuit board 6. The arm of air cylinder 100 then extends inserter head 99 to insert the leads of the component through through the holes in circuit board 6. After passing through the holes, the leads are bent by backplate 70, thereby establishing a temporary physical connection of the component to the board. The grooves in backplate 70 are aligned with the holes in circuit board 6, as shown in FIG. 8, so that the leads of a component straddle the gap between successive grooves when inserted through the holes. As the leads are driven downward, they are deflected away from one another by the sloping sidewalls of the grooves. After the arm of air cylinder 100 drives the component leads down sufficiently, they become tightly wedged in their respective holes and head 99 experiences a resistance sufficient to overcome the stiffness of the spring. Further extension of the arm of air cylinder 100 is taken up by spring 105. The force exerted on the component leads during insertion depends upon the point at which spring 105 starts to compress. Therefore, the strength of the physical connection of the leads to board 6 is a function of the stiffness of spring 105. As spring 105 compresses, ejector 102 moves through head 99 and into contact with the component to release it from slot 103. Thereafter, the arm of air cylinder 100 is retracted and the cycle is finished.

The sequencing assembly includes a motor 133 that drives a shaft 134 having cams 135, 136, 137, 138, and 139 mounted on it. These components are shown in FIGS. 1 and 3 as being mounted on top plate 12. Sequencing assembly 8 is represented schematically in FIG. 10. Cam followers (not shown) are associated with cams 135 and 136 and control the operation of switches SW-3 and SW-4, respectively. Cam followers (not shown) are associated with cams 137, 138, and 139 and control the operation of air cylinders 100, 109, and 132, respectively. When a component is selected at the beginning of the insertion operation and switch SW-2 is temporarily actuated by bar 17, alternating current appearing across terminals 140 and 141 energizes an alternating current relay R-1. After relay R-1 becomes energized, an alternative energizing path for relay R-1 that bypasses switch SW-2 is provided through a normally closed contact (second from the top) on an alternating current relay R-2 and the lower contact of relay R-1. A solenoid valve 142 is energized through the upper contact of relay R-1. Solenoid valve 142 controls the operation of air cylinder 51. Thus, when switch SW-2 closes and relay R-1 becomes energized, solenoid valve 142 causes the arm of air cylinder 51 to retract, and gate 53 opens. This condition persists until a component location on board 6 is selected.

When pointer 94 is depressed into one of holes 96 on plate 95, to select a location on board 6, switch SW-1 becomes actuated. This closes an energizing path from terminals 140 and 141 to relay R-2. The contacts of relay R-2 control several functions. First, solenoid 143 is energized through the upper contact of relay R-2 and switch SW-4 to draw an armature 144 to the left. Pointer 94 fits into a large hole 148 in armature 144. While armature 144 is moving to the left, pointer 94 is still depressed, so a groove 145 in pointer 94 is aligned with armature 144. As a result, armature 144 engages groove 145 and latches pointer 94 in the selection hole in plate 95. Thus, the position of board 6 remains fixed during component insertion. Second, motor 133 is energized through the second contact from the bottom of relay R-2. This signifies the beginning of the timing cycle. Third, an alternative energizing path is provided that bypasses switch SW-1 from the terminals 140 and 141 to relay R-2 through switch SW-3 and the lower contact of relay R-2. Fourth, relay R-1 becomes deenergized because the alternative path through the normally closed contact of relay R-2 is broken. Consequently, gate 53 closes.

As motor 133 turns shaft 134, air cylinders 100, 109, 132 are energized by their respective cams in the time sequence described above. After the selected component is mounted at the selected location on board 6, cam 136 causes switch SW-4 to open. As a result, solenoid 143 is deenergized, pointer 94 is released, and switch SW-1 opens. Shortly thereafter, cam 135 causes switch SW-3 to open and the alternative energizing path for relay R-2 is broken. Thus, relay R-2 becomes deenergized and motor 133 stops. During the described sequencing cycle, shaft 134 turns one complete revolution. When motor 133 stops, shaft 134 is positioned to repeat the cycle the next time switch SW-1 is closed.

The described apparatus can be utilized in several different ways. On the one hand, the components can be selected through assembly 3 and the location on the circuit board can be selected through assembly 7 manually by a human operator in what may be considered a semiautomatic operation. On the other hand, assemblies 3 and 7 can also be operated automatically by commands under the control of a preplanned program. Some of the advantages of the invention can also be realized by employing block assembly 5, inserter head assembly 9, and backplate 70 as separate, unattached components in a completely manual operation. In such case, the component is first placed on block assembly 5. Then slot 103 of inserter head 99 is manually brought into engagement with the component on block assembly 5 and head 99 is pressed down into assembly 5 to straighten the leads. Next, inserter head 99 is brought over the selected location on board 6 and driven manually downward. The component leads are accordingly bent by backplate 70, after which the component is released by ejector 102.

The invention has been described in connection with an integrated circuit package having a rectangular body with two rows of leads on either side because until now mounting such an electrical component on a circuit board has posed a particularly difficult problem. With appropriate modifications to block assembly 5, inserter head 99, and backplate 70, however, the principles of the invention are applicable as well to other electrical component package configurations.

What I claim is:

1. A machine for inserting the leads of a circuit component through holes in a printed circuit board comprising:

a movable carriage assembly adapted to store a variety of different kinds of circuit components;

a component selector assembly coupled to the carriage assembly;

a component location selector assembly on which a circuit board is mounted;

a block assembly adapted to receive from the carriage assembly a component selected by the component selector assembly; and an inserter head assembly movable between the block assembly and the circuit board, the inserter head assembly being adapted to engage the selected component, to carry it from the block assembly to the circuit board, and to insert the leads of the selected component through holes in the circuit board at the location selected by the component location selector assembly.

2. The machine of claim 1, in which: the parts are mounted on a baseplate; the carriage assembly moves back and forth on the back of the baseplate; the component selector assembly comprises a template having holes corresponding to the different kinds of components mounted at the front of the baseplate and a selecting peg to be inserted in the holes to select a component; a rod is provided coupling the peg to the carriage assembly, the rod being pivotably supported at a point on the baseplate between the carriage assembly and the component selector assembly so as to permit rotation of the rod in vertical and horizontal planes as the peg moves from hole to hole; and a fitting is provided between the rod and the component selector assembly to transfer the motion of the rod to the component selector assembly.

3. The machine of claim 2, in which the carriage assembly supports a plurality of stacks of components and dispenses a component of the selected kind to the block assembly responsive to the insertion of the peg in a hole of the template.

4. The machine of claim 2, in which the carriage assembly has a gate through which a selected component passes to the block assembly, the gate being actuated responsive to the rotation of the rod in the vertical plane.

5. The machine of claim 1, in which the parts are mounted on a baseplate and the component location selector assembly comprises: a table for mounting the circuit board, the table being movable in two dimensions relative to the baseplate; a template having holes in it fixed to the baseplate; and a pointer having a tip adapted to fit into the holes in the template, the pointer being attached to an extension of the table such that the position of the pointer relative to the template corresponds to the position of the inserter head assembly relative to the table.

6. The machine of claim 5, in which insertion of the component leads by the inserter head is initiated responsive to movement of the pointer tip into a hole in the template.

7. The machine of claim 1, in which the block assembly comprises: a stationary block; a component mount adapted to move into and out of the block, the surface of the block adjoining the component mount having a plurality of tapered serrations designed to straighten the component leads as the mount moves into the block; and a cutter that moves through the block transverse to the mount, the cutter having serrations in it that mesh, as the cutter moves, with serrations in one surface of the mount, when the mount is moved into the block.

8. The machine of claim 1, in which the inserter head assembly comprises: a body having a slot adapted to hold the components; a rod for driving the body toward the circuit board; and a spring-loaded fitting between the body and the rod designed to permit axial motion of the rod relative to the body after the body experiences a predetermined resistance during insertion of the leads, so that the end of the rod contacts and ejects the component held by the body.

9. The machine of claim 1, in which the component selector assembly and the component location selector assembly operate responsive to a prearranged program.

10. The machine of claim 1, in which the block assembly straightens the leads of the selected component.

11. The machine of claim 1, in which the block assembly cuts the leads of the selected component.

12. The machine of claim 11, in which the block assembly in cutting the leads of the selected component chamfers the ends of the leads so their points are precisely spaced to correspond to the centers of the holes in the circuit board.

13. Apparatus for preparing component leads for insertion through holes in a circuit board comprising:

a stationary block;

a component mount adapted to move into and out of the block;

the surface of the block adjoining the component mount having a plurality of grooves designed to straighten the component leads as the mount moves into the block; and means for precisely positioning the component leads on the block.

14. The apparatus of claim 13, having a cutter to chamfer the ends of the component leads when the mount is positioned in the block so the ends of the component leads have points precisely spaced to correspond to the centers of the holes in the circuit board.

15. Apparatus for preparing component leads for insertion through holes in a circuit board comprising:

a stationary block;

a stationary mount adapted to move into and out of the block, the surface of the block adjoining the component mount having a plurality of tapered serrations designed to straighten the component leads as the mount moves into the block and being spring-loaded against movement into the block, and a head that is adapted to grip a component on the mount and drive the component and mount into the block, the head comprising a body having a slot adapted to grip the components;

a rod for driving the body toward the circuit board; and a spring-loaded fitting between the body and the rod designed to permit axial motion of the rod relative to the body, the spring-loaded fitting being stiffer than the spring-loaded component mount so that it fails to yield as the head drives the component and mount into the block.

16. Apparatus for preparing component leads for insertion through holes in a circuit board comprising:

a stationary block;

a component mount adapted to move into and out of the block; and a cutter adapted to chamfer the ends of the component leads when the mount is moved into the block so the ends of the component leads have points precisely spaced to correspond to the centers of the holes in the circuit board.

17. The apparatus of claim 16, having means for precisely positioning the component leads on the block.

18. A method for inserting a row of leads of an electrical component through holes in a printed circuit board comprising the steps of:

chamfering the ends of the component leads so their points are precisely spaced to correspond to the centers of the holes in the circuit board through which the leads are to be inserted and inserting the leads through the holes in the circuit board.

19. A method for mounting electrical components on a printed circuit board having holes in it comprising the steps of:

engaging a component to be mounted with a component inserter assembly;

placing a circuit board with holes through it on a backplate;

driving the inserter head assembly with the component into a block assembly to prepare the component leads for insertion through the holes in the circuit board;

removing the inserter head assembly from the block assembly;

pushing the inserter head assembly toward the circuit board such that the component leads pass through the holes in the circuit board and against the backplate; and releasing the electrical component from the inserter head.

20. A machine for inserting the leads of a circuit component through holes in a printed circuit board comprising:

a stationary frame for supporting the parts of the machine;

an inserter head assembly adapted to insert the leads of a component through holes in the circuit board at a fixed location relative to the frame;

a circuit board support on which the circuit board is mounted, the circuit board support being movable relative to the frame to position different component locations on the circuit board under the inserter head assembly;

means representative of different component positions on the circuit board; and means representative of the actual position of the circuit board support relative to the frame.

21. The machine of claim 20, in which the means representative of different component positions on the circuit board is a template fixed to the frame, the template having indicia on its surface corresponding to the different component locations on the circuit board, and the means representative of the actual position of the circuit board support relative to the frame is a pointer movable relative to the frame over the template, the pointer being coupled to the circuit board support such that the pointer is located over an indicium of the template when the corresponding component location on the circuit board is located under the inserter head assembly.

22. The machine of claim 21, in which the pointer is axially movable into contact with the indicia on the template to permit comparison of the actual position of the circuit board support with a selected component position on the circuit board.

23. The machine of claim 22, in which the indicia on the template are holes into which the pointer fits, the pointer is axially movable into the holes of the template, and the inserter head assembly is actuated responsive to the movement of the pointer into a hole of the template to insert the leads of a component through holes of the circuit board.

24. The machine of claim 23, in which after the pointer is moved into a hole of the template it is held in such hole until the component inserter assembly has inserted the component.

25. A machine for inserting the leads of a circuit component through holes in a printed circuit board comprising:

a source of circuit components to be mounted;

a component block assembly to which components are supplied by the source, the block assembly being adapted to chamfer the ends of the component leads so their points are precisely spaced to correspond to the centers of the holes in the circuit board;

a circuit board support on which the circuit board is mounted; and an inserter head assembly adapted to insert the components into the circuit board from the component block assembly.

26. A machine for mounting a circuit component on a printed circuit board having rows of holes through which the leads of circuit components are to be inserted, the machine comprising:

a backplate to which the circuit board is clamped, the plate having a plurality of longitudinal grooves with inwardly sloping sidewalls that are situated under the holes in the circuit board;

a source of components to be mounted on the circuit board; and an inserter head assembly adapted to receive the components from the source and to drive the leads of the components through the holes in the circuit board and against the sloping sidewalls of the grooves to bend the ends of the leads.

27. A machine for inserting the leads of a circuit component through holes in a printed circuit board comprising:

a source of components to be mounted;

a component receiver to which the components are supplied from the source;

indexing means for precisely positioning the leads of the components on the receiver;

a circuit board support on which a circuit board is mounted; and an inserter head assembly adapted to engage the components at the receiver and to insert the leads of the components through the holes in the circuit board.

28. A machine for mounting circuit components on a printed circuit board comprising:

a movable carriage assembly adapted to store a variety of different kinds of circuit components in rows oriented transverse to the direction of movement;

a stationary receiver to which circuit components are supplied from the carriage, the receiver being located adjacent to one row of components on the carriage;

means representative of the relative position on the carriage of the different rows of components;

means representative of the actual position of the carriage relative to the receiver;

a circuit board support on which the circuit board is mounted; and an inserter head assembly adapted to take the components from the receiver and to insert their leads through the holes in the circuit board.

29. The machine of claim 28, in which the means representative of the relative position on the carriage of the different rows of components is a stationary template having indicia on its surface corresponding to the relative position on the carriage of the different rows of components, and the means representative of the actual position of the carriage relative to the receiver is a pointer movable over the template, the pointer being coupled to the carriage so the pointer is over an indicium when the corresponding row of component is adjacent to the receiver.

30. The machine of claim 29, in which the pointer is movable into contact with the template to permit comparison of the relative position on the carriage of a selected row of components and the actual position of the carriage relative to the receiver.

31. The machine of claim 30, in which the indicia on the template are holes, the pointer is movable into the holes of the template, a normally closed gate connects the rows of components on the carriage with the receiver; and the gate is opened responsive to the movement of the pointer into a hole of the template to transfer to the receiver a component from the row adjacent to the receiver.

32. A machine for inserting the leads of a circuit component through holes in a printed circuit board comprising:

a gate through which components are capable of passing;
a component receiver located on one side of the gate;
a source of components stacked one on top of the other on the other side of the gate such that the bottom component is free to pass to the receiver through the gate when it is open;
means for engaging the components at the receiver and inserting the leads of the components through the holes in the circuit board;
means for controlling the opening and closing of the gate; and
means for holding the component in the source directly above the bottom component while the gate is open and for releasing said held component while the gate is closed.

33. A machine for inserting the leads of a circuit component through holes in a printed circuit board comprising:

a passage capable of passing components one at a time;
a component receiver located on one side of the passage;
a source of components stacked in single file on the other side of the passage such that the components move through the passage to the receiver when unrestrained;
first means for alternately restraining and releasing the end component from the source nearest the passage; and
second means for alternately releasing and restraining the component from the source next to said end component, the first and second means alternating in opposition to each other.

34. The machine of claim 1, in which the inserter head engages the selected component at the block assembly, the inserter head and the block assembly cooperating to prepare the leads of the selected component upon engagement.

35. The machine of claim 34, in which the components are dual in-line components, the block assembly has a component mount adapted to support the selected component such that the rows of leads straddle the mount, and the inserter head engages the mount as it engages the selected component.

36. The machine of claim 1, in which the inserter head engages the selected component at the block assembly, the inserter head and the block assembly cooperating to straighten the leads of the selected component upon engagement.

37. The machine of claim 20, additionally comprising means responsive to the coincidence between the representation of a selected component position and the representation of the actual position of the circuit board for actuating the inserter head assembly to insert the leads of a component through the holes of the circuit board at the selected location.

38. The machine of claim 21, additionally comprising means responsive to the coincidence in space between the indicium of a selected component position and the pointer for actuating the inserter head assembly to insert the leads of a component through the holes of the circuit board at the selected location.

39. The machine of claim 28, additionally comprising means responsive to the coincidence between the representation of a selected row of components and the representation of the actual position of the carriage for supplying a component from the selected row to the receiver.

40. The machine of claim 29, additionally comprising means responsive to the coincidence in space between the indicium of a selected row of components and the pointer for supplying a component from the selected row to the receiver.

41. The machine of claim 39, in which the components are dual in-line components, the block assembly has a component mount adapted to support the selected component such that the rows of leads straddle the mount, and the inserter head engages the mount as it engages the selected component.

42. Apparatus for preparing the leads of a dual in-line component for insertion through holes in a circuit board comprising:

a component receiving block adapted to be straddled by the component leads;
means for precisely positioning the component leads on the block;
a component grasping head for engaging a component at the block; and
means responsive to the engagement of a component at the block by the head for straightening the component leads.

43. A machine for inserting the leads of a dual in-line circuit component through holes in a printed circuit board, the machine comprising:

a movable carriage assembly adapted to store a variety of different kinds of circuit components;
a component selector assembly coupled to the carriage assembly;
a component location selector assembly on which a circuit board is movably mounted;
a block assembly having a component mount adapted to receive a selected component from the carriage assembly responsive the the component selector assembly, the component mount supporting the selected component such that the rows of leads straddle the mount; and
an inserter head assembly movable between the block assembly and the circuit board, the inserter head assembly being adapted to engage the selected component and the component mount at the block assembly, to carry the selected component from the block assembly to the circuit board, and to insert the leads of the selected component through holes in the circuit board at the selected location responsive to the component location selector assembly.

44. A machine for inserting the leads of a dual in-line circuit component (i.e., a component having a plurality of leads arranged in two lines) through holes in a printed circuit board, the machine comprising:

A movable carriage assembly adapted to store a variety of different kinds of dual in-line circuit components;
a component selector assembly coupled to the carriage assembly;
a component location selector assembly on which a circuit board is movable mounted;
a block assembly adapted to receive a selected component from the carriage assembly responsive to the component selector assembly;
an inserter head assembly movable between the block assembly and the circuit board, the inserter head assembly being adapted to engage the selected component at the block assembly, to carry it from the block assembly to the circuit board, and to insert the leads of the selected component through holes in the circuit board at a selected location responsive to the component location selector assembly; and
indexing means for precisely positioning the lead on one end of each line of the selected component on the block assembly so the position of the lines of leads is fixed relative to the inserter head and the component location selector assembly.

PO-1050
(5/69)

UNITED STATES PATENT OFFICE
CERTIFICATE OF CORRECTION

Patent No. 3,591,911 Dated July 13, 1971

Inventor(s) Sandor Goldschmied

It is certified that error appears in the above-identified patent and that said Letters Patent are hereby corrected as shown below:

Patent column 2, line 67, "Fixture 19 by itself" should be --Fixture 19 is itself--.

Figure 10:
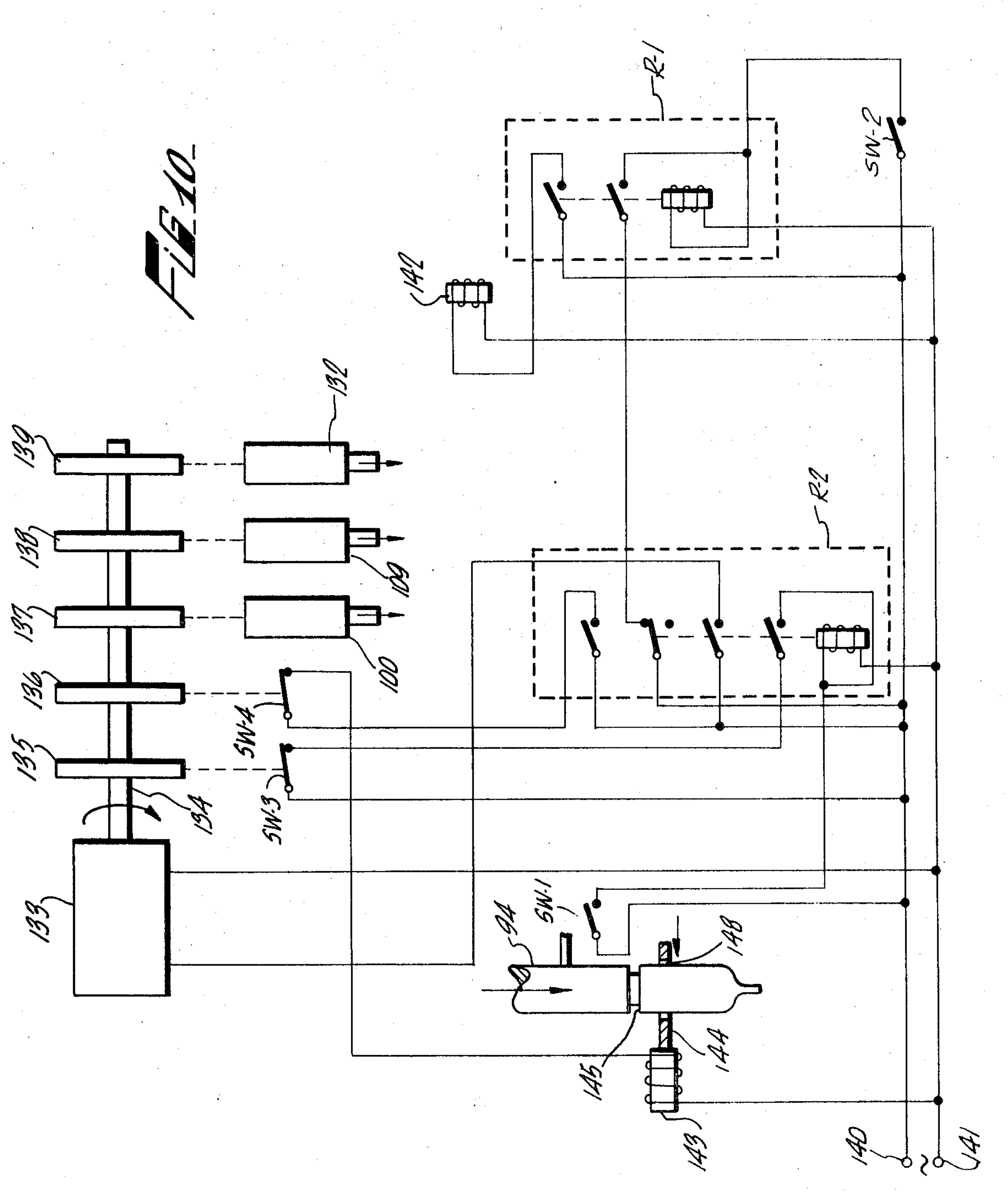
FIG. 10 is a schematic diagram of a sequencing assembly for controlling the operation of the machine.

Patent column 4, line 37, the exclamation point before "FIG. 10" should be deleted.

Patent column 5, line 44, "cylinder 132" should be --cylinders 132--.

Patent column 6, line 4, one "through" should be deleted;
line 62, "selection" should be --selected--.

Patent column 8, line 66, "stationary" should be --component--.

Patent column 12, line 33, "the", first occurrence, should be --to--;
line 54, "movable" should be --movably--.

Signed and sealed this 13th day of June 1972.

(SEAL)
Attest:

EDWARD M.FLETCHER, JR.
Attesting Officer

ROBERT GOTTSCHALK
Commissioner of Patents